United States Patent [19]

Avni

[11] Patent Number: 5,347,572
[45] Date of Patent: Sep. 13, 1994

[54] TELEPHONE LINE MONITORING APPARATUS AND METHOD

[75] Inventor: Shlomo Avni, Givataim, Israel

[73] Assignee: Teletron Ltd., Petah Tikva, Israel

[21] Appl. No.: 755,128

[22] Filed: Sep. 5, 1991

[30] Foreign Application Priority Data

Sep. 6, 1990 [IL] Israel ................................. 095601
Sep. 6, 1990 [IL] Israel ................................. 095602

[51] Int. Cl.$^5$ ..................... H04M 11/00; H04N 1/00
[52] U.S. Cl. ..................................... 379/100; 379/96; 379/35; 358/400; 358/442
[58] Field of Search ................. 379/100, 85, 67, 68, 379/88, 412, 35, 34; 358/444, 400, 401, 442, 468

[56] References Cited

U.S. PATENT DOCUMENTS

| | | | |
|---|---|---|---|
| 4,446,335 | 5/1984 | Lee et al. ........................... | 379/85 |
| 4,451,707 | 5/1984 | Hanscom . | |
| 4,567,328 | 1/1986 | Carrasco et al. . | |
| 4,612,417 | 9/1986 | Toumani ............................ | 379/413 |
| 4,652,700 | 3/1987 | Matthews et al. . | |
| 4,661,878 | 4/1987 | Brown et al. ...................... | 379/412 |
| 4,661,979 | 4/1987 | Jakab ................................ | 379/412 |
| 4,796,091 | 1/1989 | Nohtomi . | |
| 4,802,207 | 1/1989 | Uchida . | |
| 4,815,120 | 3/1989 | Kosich . | |
| 4,932,048 | 6/1990 | Kenmochi et al. ................. | 379/100 |
| 4,964,160 | 10/1990 | Traube et al. ..................... | 379/412 |
| 4,989,238 | 1/1991 | Iggulden et al. ................... | 358/444 |
| 4,998,272 | 3/1991 | Hawkins, Jr. et al. .............. | 379/88 |
| 5,090,049 | 2/1992 | Chen ................................. | 379/102 |
| 5,161,183 | 11/1992 | Maytum ............................ | 379/412 |

FOREIGN PATENT DOCUMENTS

| | | |
|---|---|---|
| 0281147 | 9/1988 | European Pat. Off. . |
| 0351445 | 1/1990 | European Pat. Off. . |
| 0355838 | 2/1990 | European Pat. Off. . |
| 63-100850 | 9/1988 | Japan . |
| 63234658 | 1/1989 | Japan . |
| 1051705 | 6/1989 | Japan . |
| 62005758 | 6/1989 | Japan . |
| 2095932 | 10/1982 | United Kingdom . |
| 2205216 | 11/1988 | United Kingdom . |
| 9002462 | 3/1990 | World Int. Prop. O. . |

*Primary Examiner*—Curtis Kuntz
*Assistant Examiner*—Stella L. Woo
*Attorney, Agent, or Firm*—Merchant & Gould, Smith, Edell, Welter & Schmidt

[57] ABSTRACT

A fax monitoring apparatus comprises one or more line interface circuits to simultaneously detect and analyze audio signals produced on any given telephone line by two connected fax machines, analyzing circuitry to analyze and interpret the audio signals to form a compressed fax image, expansion circuitry to expand the compressed fax image into a bit-mapped image, memory to store the compressed fax image and/or the bit-mapped image, and display to display the bit-mapped image of the original fax transmission.

7 Claims, 7 Drawing Sheets

TELEPHONE LINE MONITORING APPARATUS AND METHOD

FIELD OF THE INVENTION

The present invention relates to fax monitoring apparatus. More particularly, the invention relates to a monitoring apparatus which is capable of monitoring fax transmissions which take place between two fax transmitting apparatus connected through a telephone line.

In another aspect, the invention relates to the monitoring of telephone lines, and more particularly to a method by means of which it is possible to identify the type of activity associated with a telephone line which is being monitored, and to record such activity.

BACKGROUND OF THE INVENTION

Fax transmissions have become more and more popular, and the volume of information transmitted through fax machines is increasing steadily. This has caused a number of problems, for instance, in that unauthorized transmission of material may occur from a given location, without leaving any trace, or fax machines may be used for criminal activities to bypass police wiretapping of normal telephone lines.

The present invention has as an object to provide a fax monitoring machine which may monitor, record, store and retrieve fax transmissions which intervene between any two fax machines. Thus, it is one object of the present invention to provide a machine which may be located between any two fax machines which are communicating, may receive information transmitted from both fax machines during communication, and may permit to follow a transmission and analyze the material transmitted.

If the apparatus of the invention is used in open analysis of transmission, e.g., in an industrial location, it is not overly important to make sure that the transmitting and receiving fax machines do not detect that the transmission is being followed (however, it is of course necessary to avoid disturbances of the line which may cause a malfunction of the machines). On the other hand, in many other applications, such as for police wiretapping, it is important that the transactions of transmitting and receiving fax machines be monitored and recorded by the monitoring apparatus without making it evident that wiretapping exists. In all cases, it is desirable to avoid any interference with the two communicating machines. It is therefore necessary to provide an interface which is "transparent" to the handshake, and which does not leave any record of its presence, either on the transmitting or the receiving machine, and which cannot be easily discovered by line-analyzing apparatus. Such a monitoring apparatus interface must be activated by the activity taking place on the telephone line between the two monitored machines, must record the transmission intervening between the two machines, but must not interfere with the transmitted signals or transmit any signal which actively takes part in the handshake between the apparatuses. Providing such an interface is one of the purposes of this invention. It should be noted, however, that such a transparent interface will not prevent the operator from voluntarily interfering with the transmission, e.g., to stop the transmission of a non-authorized message, if appropriate interference means are provided.

Thus, it is another object of the invention to provide a fax monitoring apparatus which can effectively monitor transmission of fax messages occurring between two fax apparatuses, without leaving any trace of its presence, either on the transmitting or the receiving apparatus, and without being easily detectable by wiretapping-detecting apparatus.

It is well known in the art to connect two telephone lines, for instance for policing purposes, and to eavesdrop on telephone conversations. However, when monitoring a plurality of lines at the same time, it is necessary to provide means for the automatic identification of activity starting and ending, and for the recording of telephone activity in an automatic manner, since a single operator is not capable of following a large number of telephone lines. In the art there are known devices which can be connected to telephone monitoring and recording apparatus for this purpose, which identify the starting and ending activity of a given telephone line by following the changes in voltage of the line. As it will be understood by a skilled person, using the telephone line, e.g., by lifting the receiver, results in changes of voltage which drops, when the line is used, from its previous value to a lower value. The problem with this type of monitoring is that different telephone lines show different voltages, depending on the type of line, area, position of connection to the telephone line, and so on. Therefore, although nominal voltages of about 48 V should exist on normal telephone lines, in many instances the actual value is much lower, and sometimes even higher. Furthermore, the amount of voltage drop, after the receiver is lifted, is highly dependent on the distance between the receiver and the exchange central. For this reason devices known in the art are provided with adjusting means, normally a potentiometer, for adjusting the reference voltage before initiating monitoring of a telephone line.

These devices known in the art suffer from several considerable disadvantages. First of all, it is necessary to adjust the reference voltage for each monitored telephone line every time the device is allocated to a different monitored line. This is laborious and time-consuming. Furthermore, even when the same telephone line is monitored, fluctuations in the actual voltage of the line exist, so that the actual value may be different from the reference value which has been set by the operator, which results in faulty functioning of the system, missing required activations of the recording apparatus, etc.

It is therefore another object of the present invention to provide a method which overcomes the aforesaid disadvantages, and which can be used for accurately monitoring the activity of a telephone line, without the need for manual settings of reference values.

It is still a further object of the invention to provide an apparatus which can be used for the aforesaid purposes.

It should be noted that by "telephone line" it is intended to include all lines which are adapted to be used for transmitting telephone conversations, including lines which are dedicated to telecopying apparatus or computer transmission or the like. Thus, the outcome of the monitoring of a given telephone line could be a recording of a fax transmission or a voice conversation, or any other type of data transmission, and the actual nature of the transmitted conversation is not important for the purposes of this invention.

The fax monitoring apparatus according to the invention comprises:

One or more line interface means to simultaneously detect and analyze all audio signals produced on any given telephone line by two connected fax machines;

Analysis means to analyze and interpret the said audio signals to form a compressed fax image;

Expansion means to extend the compressed fax image into a bit-mapped image;

Storage means, to store the compressed fax image and/or the bit-mapped image;

Display means to display the bit-mapped image of the original fax transmission; and Optionally, printing means to provide a hard copy of the transmission or part thereof.

According to one embodiment of the invention, the storage means comprise a temporary memory or buffer, and one or more hard disks. Furthermore, in another embodiment of the invention, the storage means further comprise one or more digital cartridge recorders and, optionally, one or more floppy diskette drive and/or optical disk drive. Of course, any other mass storage media can be employed, as becomes available from time to time.

According to a preferred embodiment of the invention, the line interface means comprise a non-interfering line interface device comprising a circuit consisting of two symmetrical main branches connected to an isolation amplifier, two or more protectors being connected parallel to the isolation amplifier, the said two protectors being connected to the ground and the total impedance of each branch before the connection to the protector line being substantially smaller than the impedance of the branch after the said connection. Preferably the ratio of the smaller to the greater impedance of each branch is about 1:5.

According to another preferred embodiment of the invention a separate modem is provided for each monitored telephone line. This is different from other existing apparatus in which it is attempted to exploit a single modem for several telephone lines. It has been found that using the same modem for a number of lines is not convenient, because one modem can take care of a single telephone line at a time, and when two different telephone lines are operating at the same time, and fax transmissions are transmitted thereon, one single modem cannot handle both.

The apparatus according to the present invention can further be used to monitor and record mixed voice/fax transmissions. Additionally, the apparatus can be exploited for monitoring and recording telephone transactions which are entirely voice transactions. This, as will be apparent to a person skilled in the art, is very important because in many instances fax transmissions are preceded or followed by voice conversations, or a telephone line which is in principle dedicated to fax transmissions can be used for voice conversations. According to one embodiment of the invention, this is achieved by adding an analogue-to-digital transducer connected in parallel to each modem, to transform audio signal transmitted through the telephone line into digital storable information.

The apparatus can be activated by any suitable method which permits to recognize the activity of the telephone line. One such method which is novel and forms a part of the present invention comprises:

continuously sampling the voltage of the telephone line to be monitored;

calculating the mean value of the voltage from a plurality of samplings taken during a given time interval;

comparing the said mean value of the voltage with a reference voltage defined as the mean voltage obtained during the previous time interval;

replacing the value of the reference voltage with the said mean value;

if the difference between the last calculated mean value and the reference value exceeds a predetermined value:

(a) stopping the replacement of the reference voltage with the mean calculated value of the voltage;

(b) activating signal recording means to record signals transmitted through the telephone line;

(c) continuously comparing the calculated mean value with the reference value, and if the difference between the two compared values is below a predetermined minimal value:

1) deactivating the signal recording means; and 2) resuming the replacement of the value of the reference voltage with the calculated mean value of the voltage, and the subsequent steps.

The signal recording means referred to above can be, in this case, an apparatus according to the invention.

According to a preferred embodiment of the invention, the method further comprises recording and analyzing the telephone number which is dialed by a monitored telephone line, which method includes the steps of:

(1) identifying dialing beginning by comparing the calculated mean value of the voltage and the reference voltage, and determining whether the difference is below a predetermined maximal value;

(2) counting the number of pulses of high voltage occurring within about 0.1 second from one another (±a predetermined tolerance), to determine the dialed digit;

(3) identifying the end of one dialed digit by identifying a low-voltage interval of a length exceeding about 0.1 second (±a predetermined tolerance);

(4) recording the said pulses of high voltage or the equivalent digits of the dialed number in the signal recording means.

As in many instances mixed dialing, including pulse and tone signals, is employed, e.g., to activate a telephonic secretary, a preferred embodiment of the invention further comprises providing tone-detecting means to identify and record tone-modulated codes and/or digits.

While the maximal difference between the calculated mean value of the voltage and the reference value can be changed, on the basis of various considerations which are within the scope of the person skilled in the art, it is preferred to initiate recording of telephone line activity when the calculated mean value is equal to or less than 80–85% of the reference voltage.

The mean calculated voltage is obtained, as said above, by averaging a large number of samplings taken during a very short period of time. In a preferred embodiment of the invention, the mean calculated voltage is the arithmetic mean of 200 to 5,000 samplings, preferably about 1,000 samplings taken during a time interval of about 1 second.

The activity of a telephone line may be recorded on a variety of recording media. In a preferred embodiment of the invention the recording means comprise digital recording apparatus, and the activity of the telephone line is saved in the form of a digital record.

The invention further encompasses a device for monitoring and analyzing the activity of a telephone line, which device comprises:

sampling means for continuously sampling the voltage of the telephone line;

calculating and comparing means for calculating and comparing mean values of the line voltage. These calculating and comparing means may be, e.g., a microcomputer or a microprocessor;

activating means for activating signal recording means. These activating means may, again, comprise a microprocessor or a microcomputer; and signal recording means to record the activity of the telephone line.

Encompassed by the present invention is also a method of monitoring fax communication, which method comprises the steps of:

a) providing line interface means connected to a telephone line to be monitored;

b) providing activating means to detect line activity comprising one of start/stop activity, ringing and dialing pulse and DTMF signalling;

c) providing interpreting means activated by the said activating means;

d) interpreting fax transmissions by means of the interpreting means when line activity is detected;

e) assembling the interpreted fax transmission into compressed fax images;

f) storing the compressed fax images in memory means;

g) retrieving the stored con, pressed fax images and expanding them to bit-mapped images of the original message; and h) displaying the bit-mapped images on display means, or printing them out on printing means.

In a preferred embodiment of the invention, the display means comprise a graphic screen, whereby information can be displayed on the screen. The screen can also be exploited to look for information to be printed on the printer.

In order to further illustrate the invention, FIGS. 1 to 7 are provided, in which:

Figure 5:
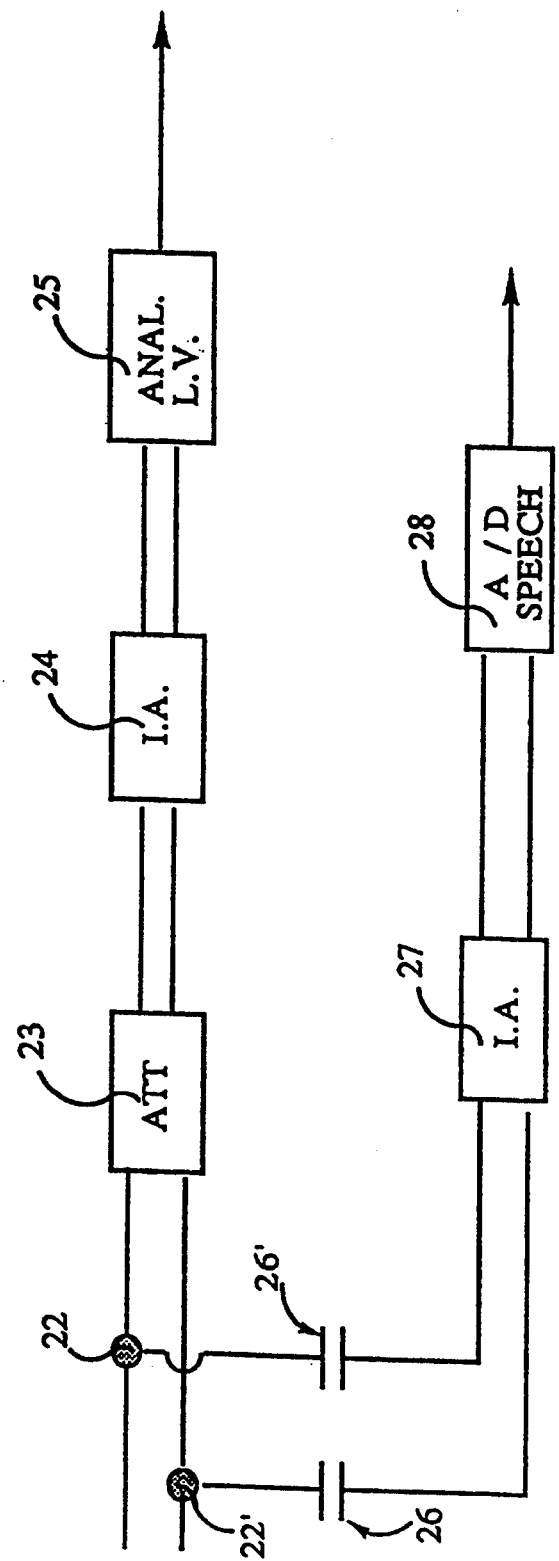
Figure 6:
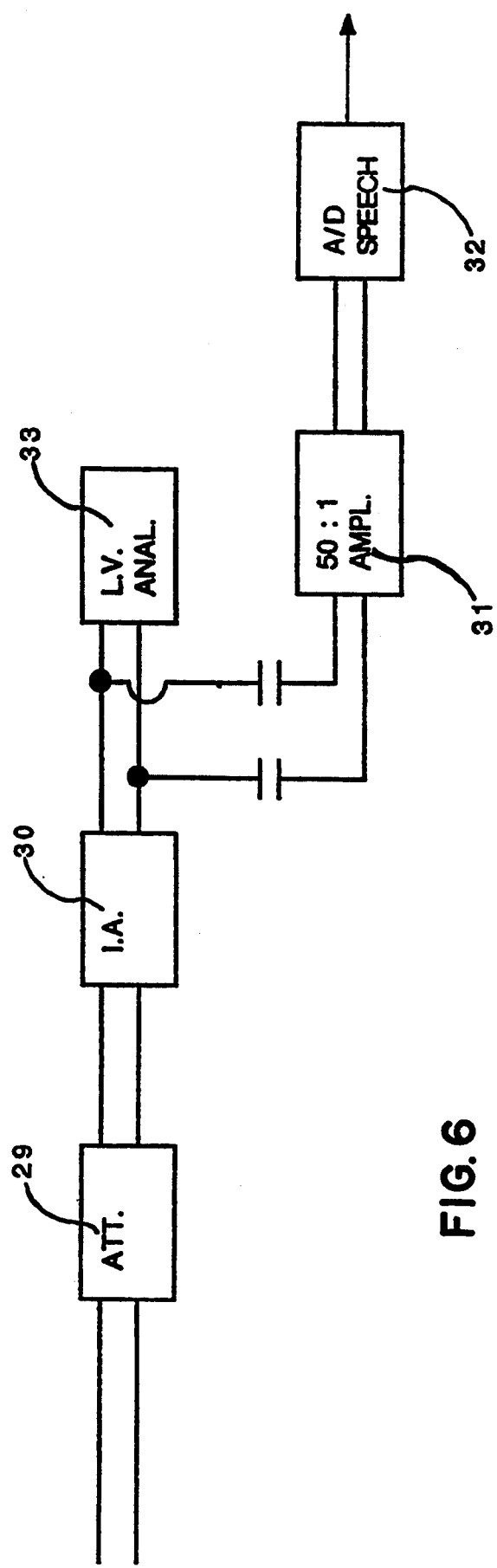

FIGS. 5 and 6 each show an alternative system set-up, in block diagram; and

Figure 7:
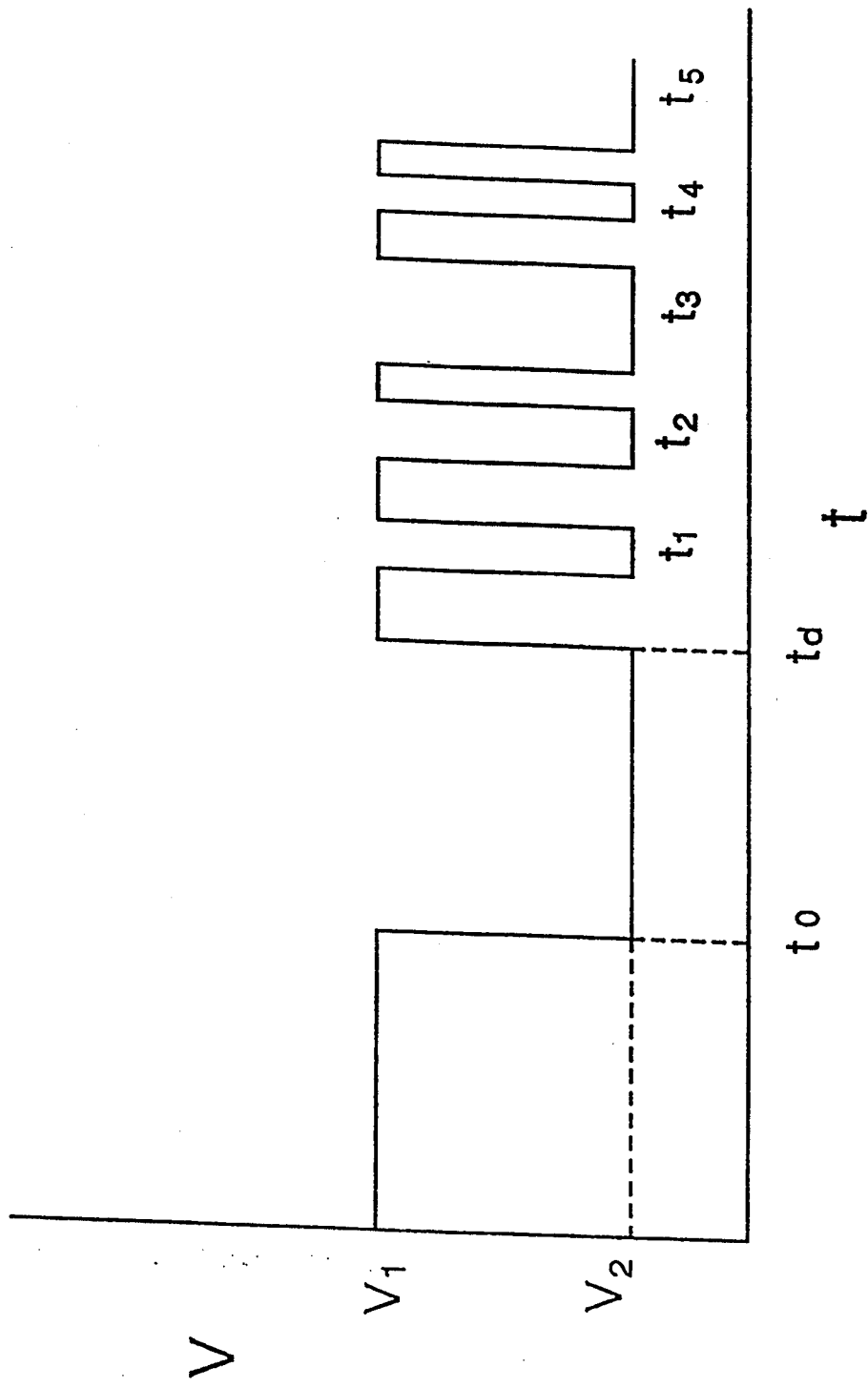

FIG. 7 shows the activity of a telephone line from which a number is being dialed.

Figure 1:
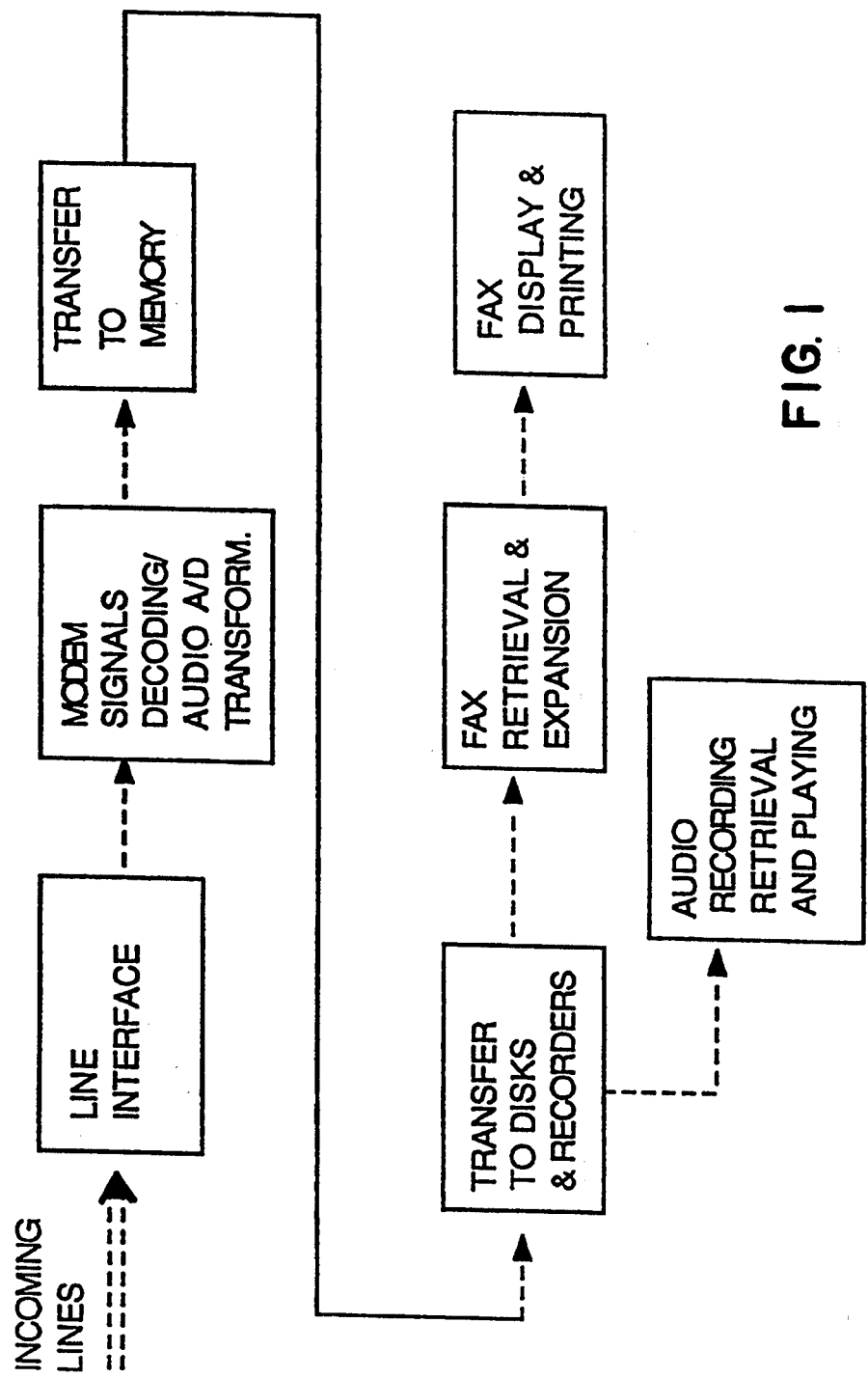
FIG. 1 is a block diagram of the information flow in a device according to an embodiment of the invention.

In FIG. 1, it is seen that the incoming lines are fed to the line interface to be described with reference to FIG. 4. Under this protection the signals are fed through decoding means, which decode the modem signals or translate voice modulation into digital data and transfer the signals to memory means in the apparatus. These memory means are the temporary memory means, from which the information is transferred to storage media such as hard disks and tape recorders. When it is desired to view the information and analyze it, the fax information is retrieved from the hard disk or the tape, is expanded and is sent to view means, e.g., a screen or a printer. Similarly, voice information can be retrieved for and sent to appropriate voice regeneration apparatus.

Figure 2:
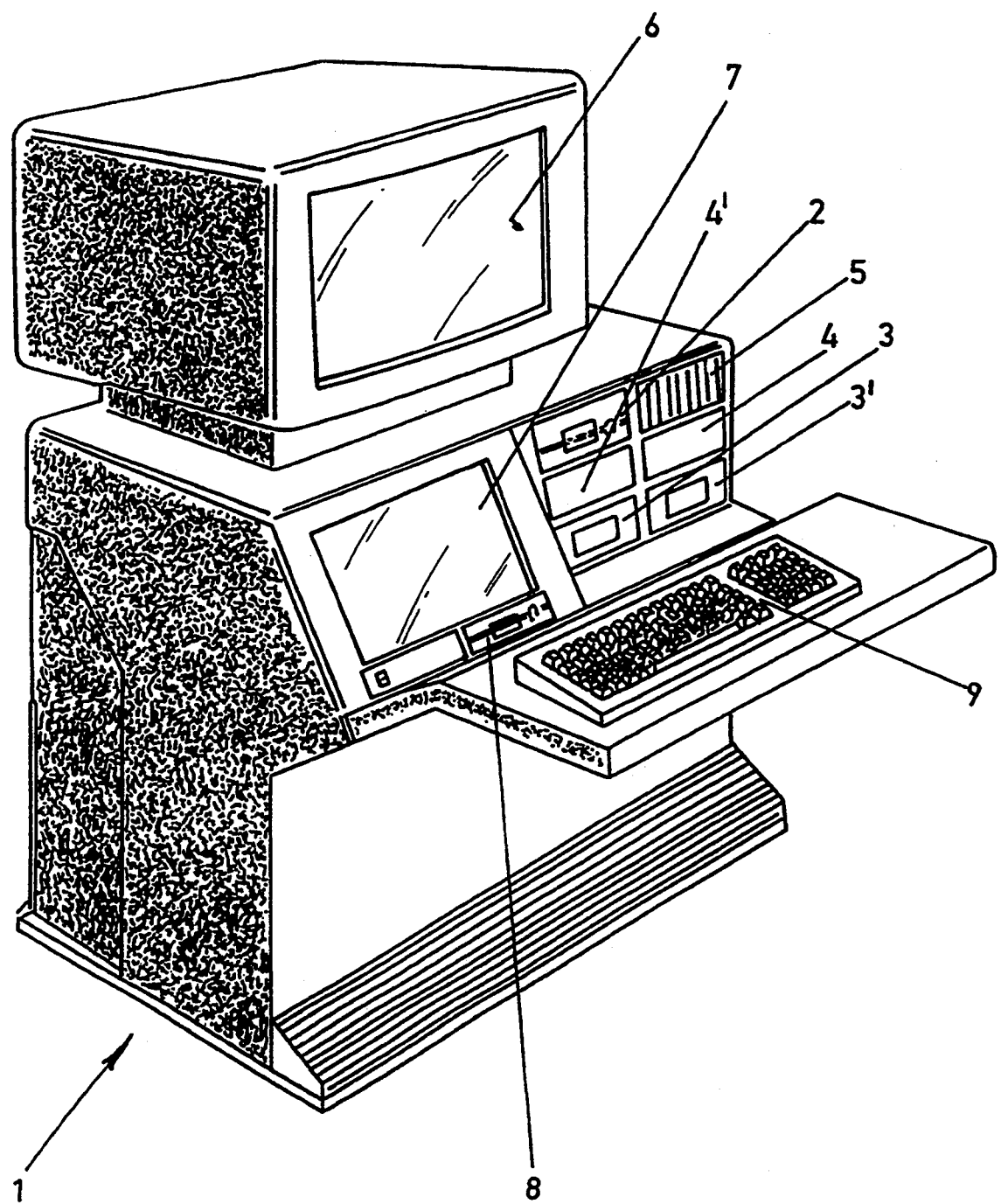
FIG. 2 is a schematic view of an apparatus according to one embodiment of the invention.

Turning now to FIG. 2, an apparatus according to one embodiment of the invention is indicated by numeral 1. This apparatus comprises interface means (not shown), floppy disk drive 2, two digital casette recorders 3 and 3', and two hard disks, 4 and 4'. A casette compartment 5, is also shown, which of course is not essential. The apparatus is provided with two screens, a graphic screen 6, on which fax images are displayed, and a messages screen 7, which is used by the operator for messages, for instance for working with the memory means, to retrieve specific fax messages by their stored names, and for other control activities. An additional floppy disk drive 8 is provided, which is used to start up the program which controls the operation of the device. The operation of the apparatus is controlled through a keyboard 9, which is used to input commands for the various operations of the apparatus.

Thus, when a fax message is detected and is sent by the line interface means to the decoding means, after having been decoded it is stored in the hard disks 4 and 4', and in the digital casette recorders, 3 and 3'. Normally, storage from the temporary memory buffer is done in the hard disks, and later the information is transferred to the digital casette. However, it is possible to indicate which kind of information is to be maintained on the hard disk for an early review, and which is to be sent to the digital casette for long-term storage.

When the operator wishes to view a specific fax message, he gives the appropriate commands through the keyboard 9 and the message appears on the graphic screen 6. Alternatively, or additionally, the message may be automatically printed out by a line printer, not shown in the figure for the sake of simplicity. The line printer should preferably be a laser printer or another comparably high-speed and heavy duty device.

The operator will identify different messages through the messages screen, e.g., by telephone numbers, time of transmission, or any other indication. Thus, for instance, if the operator sees on the message screen 7 that a given fax apparatus is transmitting, he will also see on the messages screen how and where the fax transmission is being stored, will be able to retrieve the fax transmission, view it on the graphic screen 6, and if desirable, will be able to print it out on a printer.

As will be readily understood by the skilled person, the mode of operation described above is unique inasmuch as it permits to monitor a very large number of telephone lines, to store fax messages transmitted therethrough on long-term storage media, to review the messages at will, and to provide hard copies of these messages. This is achieved by the unique combination of elements and the method of operation of the apparatus of the invention. Of course, the invention can conveniently be exploited also when a single line is monitored.

Figure 3:
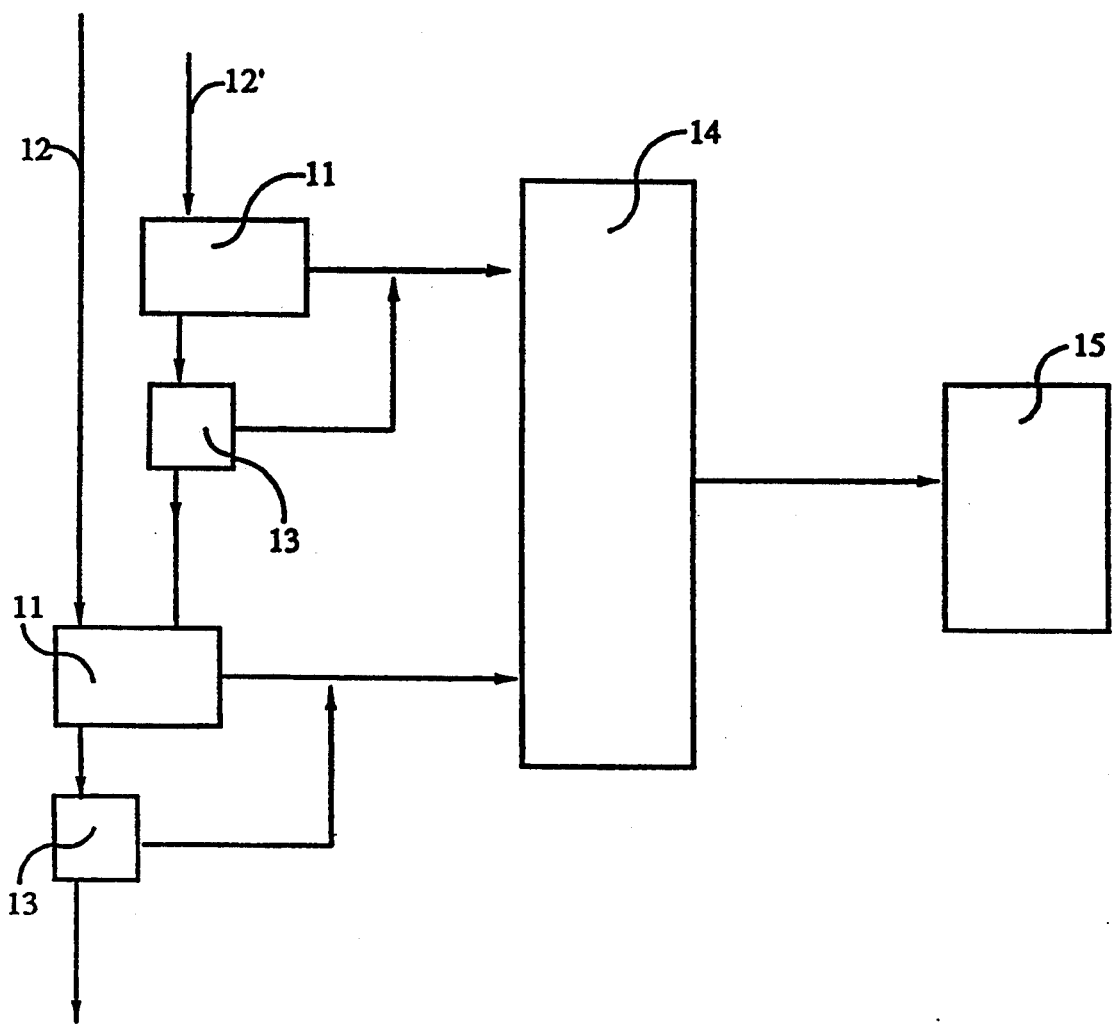
FIG. 3 is a schematic representation of part of the receiving part of an apparatus according to one embodiment of the invention.

In FIG. 3 the receiving part of the apparatus of FIG. 2 is schematically shown, which comprises a plurality of modems 11, each of the said modems being connected to a telephone line 12, only two such modems and telephone lines being shown, for the sake of simplicity. Parallel to each modem there is connected an analogue-to-digital transducer 13, which has the purpose of translating voice messages into digital data. Memory means 14 are provided, for intermediate storage of data received from modem 11 or A-to-D transducer 13, which can be divided in a plurality of sub-units, or which can consist of separate and connected memory units. The intermediately stored information from intermediate memory means 14 subsequently flows to central or main elaborating means 15, not described in detail here and which have been described with reference to FIGS. 1 and 2.

As will be apparent to a person skilled in the art, the modem 11 is only capable of recognizing fax transmissions and therefore it will be activated only when the information transmitted on the telephone line is a fax transmission. If speech is transmitted on the telephone line, then the A/D transducer 13 will be activated, and modem 11 will not be operative. Information will flow from the telephone line to intermediate memory means 14 via the A/D transducer 13.

Figure 4:
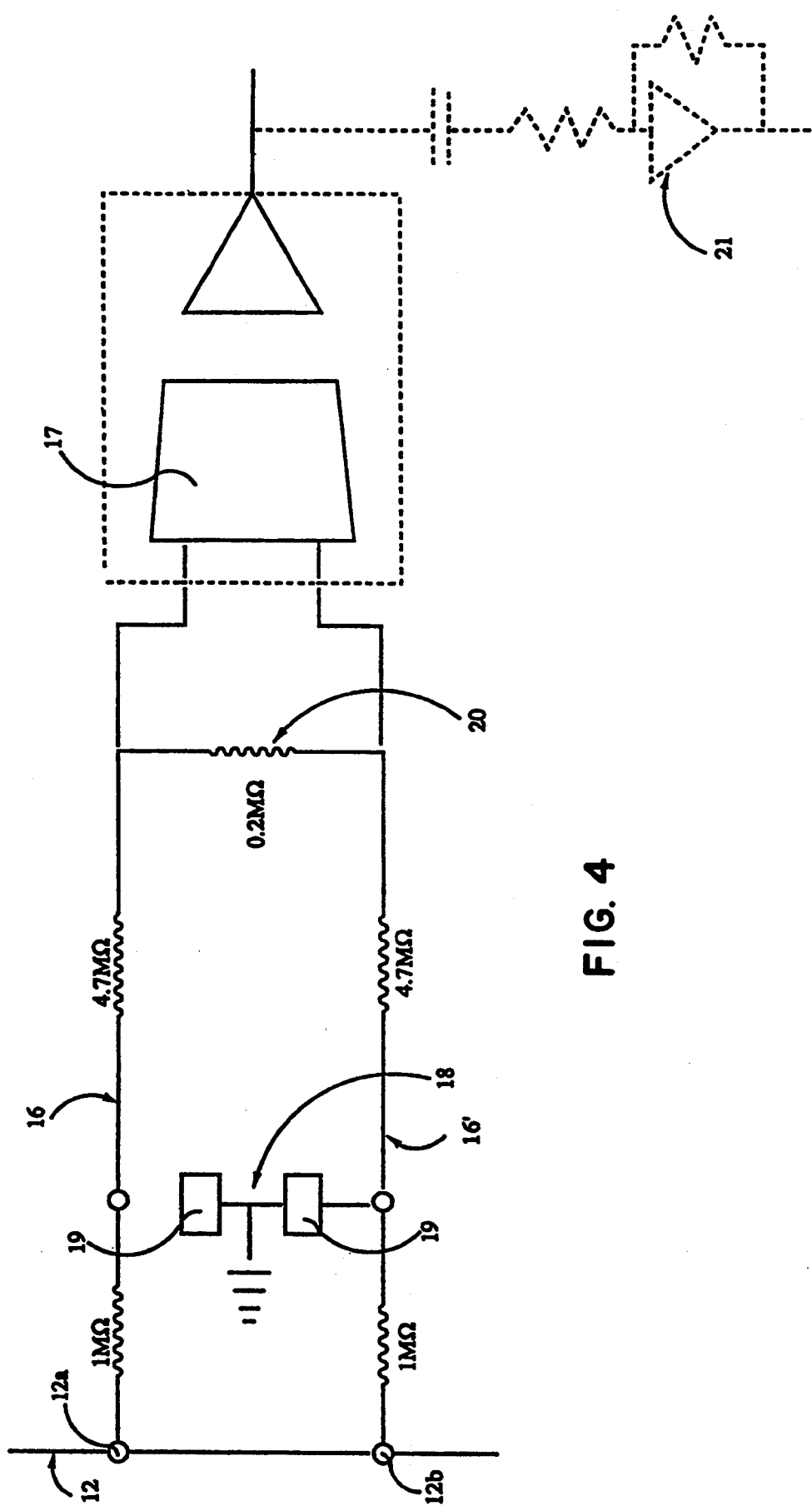
FIG. 4 is a diagram showing a line interface according to the invention.

Referring now to FIG. 4, the line interface device shown in the figure is connected to telephone line 12 through connections 12a and 12b. The circuit which constitutes the line interface has two identical branches generally indicated by 16 and 16', which are connected to the bases of an isolation amplifier 17. Connected and parallel to the isolation amplifier 17 there is a protecting branch 18, on which there are located two protectors 19, between which there is found the connection to the ground. An additional impedance, indicated by numeral 20, is also found in parallel to the isolation amplifier. As will be seen from the figure, the total impedance of the part of branch 16 which is found between connection 12a and protecting branch 18 is much smaller than the remaining impedance of the same branch, being 1 MΩ, the remaining impedance being, in this particular embodiment of the invention, 4.7 MΩ. It should be understood that the dimensions of the impedances in this circuit are dictated by the various requirements of the circuit. On the one hand, it is necessary to provide the highest possible impedance, to render the interface as much non-detectable as possible. On the other hand, the protectors 19, together with the resistance found before them, will constitute a filter to the signal coming from the telephone line, because the protectors include a capacitance. Thus, it is necessary to divide the resistance along the branch of the circuit to maintain a high level of non-detectability, while avoiding too high a filtering effect of the various components. One suitable isolation amplifier is, e.g., the AD202 amplifier, manufactured by Analog Devices, Inc.

The reduction of the signal from the telephone line resulting from the arrangement of the circuits shown in FIG. 4 is about 50:1. This enables the line voltage analyzing circuitry to deal with low level signals. However, since the audio signals are also attenuated by the same ratio it is necessary to amplify further the audio signal after the isolation amplifier. According to one embodiment of the invention, an additional amplifier, which need not be an isolation amplifier, is provided after the isolation amplifier 17, as indicated in broken lines by numeral 21 in FIG. 4.

An alternative embodiment is shown in FIG. 5 in block diagrams. According to this embodiment there are provided two separate branches, connected to the telephone line at connections 22 and 22'. The upper branch contains an attenuator 23, an isolation amplifier 24, and line voltage analysis means, 25. The lower branch contains two capacitances, 26 and 26', an isolation amplifier 27, and an A/D transducer.

The telephone line conveys to the interface of FIG. 5 two combined signals: the DC line voltage (up to about 200 V when ringing) and AC information (about 1 V), carrying audio (speech and fax) information.

After attenuation at the attenuator 23, which as said is of the order of 50:1, the voltage can be transmitted through the isolation amplifier. At this point the DC voltage can be analyzed, but the AC voltages are too low for analysis. For this reason, in this embodiment of the invention there is provided the lower branch, and the DC voltage is blocked by capacitances 26 and 26', while the audio signal is transmitted to a second isolation amplifier 27, and then to an A/D device 28.

Alternatively, the system may operate as in FIG. 6, and the signal attenuated by attenuator 29 can be passed, after isolation amplifier 30, to a second branch and to amplifier 31, where the AC signal is amplified by a factor of 50 and then fed to the A/D transducer 32.

The A/D transducer does not discriminate between speech and fax signals, but the modem can identify fax messages. Thus, it is possible to control the operation of the A/D device according to the recognition of fax signals based on the modem.

In order to better understand the method of monitoring and analyzing the activity of a telephone line, reference is made to FIG. 7, which shows the activity of a telephone line from which a number is being dialed. The normal voltage of the line, when no activity exists, is indicated by $V_1$. This is the higher voltage which, nominally, is 48 V. When the receiver is lifted, the voltage drops very quickly to a lower value, $V_2$, which happens at $t_0$. The value of $V_2$ is normally between 10–30 V.

In FIG. 7 we see that the receiver has been lifted at $t_0$, dialing has begun at $t_d$, and different digits are being dialed which reflect in pulses shown in the figure. The first digit is a 3, as can be seen by three different pulses of higher voltage. The time intervals $t_1$ and $t_2$ are of 0.1 second or less, and interval $t_3$ is greater than 0.1 second, indicating that the first group of pulses has ended. The first group includes three pulses, so that the first digit is 3, the second group includes two pulses, so that the second digit is 2. Further digits are not shown, for the sake of simplicity.

According to the method of the invention, the value of $V_1$ is sampled continuously, and if no difference exists between two subsequently calculated values (within a predetermined tolerance), the last calculated value becomes the reference value. When the receiver is lifted the difference $V_1-V_2$ exceeds the predetermined maximal difference, as $V_2$ is less than 80–85% of $V_1$, and recording of the activity of the line begins. This recording will include all that happens from the time $t_0$ onwards, until such time as the voltage of the telephone line climbs again to a value about the last recorded value of $V_1$, and remains stable for a period of time of several seconds. At that time the recording of the activity of the telephone line stops.

It should be noted that, if desired, it is also possible to identify and record incoming calls. When the telephone is ringing at the monitored end, pulses of a higher and lower voltage are detected around the nominal $V_1$ value without any lower voltage base-line, because the receiver has not been lifted. It is possible to start recording the activity of the telephone line beginning with incoming calls, in addition to with the lifting of the receiver. Then, when an incoming call is detected, if nobody lifts the receiver recording will stop when the pulses about the nominal $V_1$ voltage stop and the voltage remains stable for a period of time of a number of seconds. On the other hand, if the receiver is lifted, then the situation is like that depicted in FIG. 7, beginning at time t₀, and recording will continue as described above.

It should be noted that most telephone exchanges employ the line-reversal technique for outgoing calls to indicate the establishment of the connection with the called party. In this technique, the line changes its polarity at the instant in which the handset of the called party is lifted, while preserving its absolute value. Since while sampling the line voltage it is possible to determine its polarity, activating the recording means can be delayed until the connection with the called party has been established.

As will be appreciated by a person skilled in the art, the method of the invention is very convenient inasmuch as it "learns" the telephone line it is monitoring, it permits to adjust the threshold value to the actual value existing on the telephone line, even if this value changes with time during the day or during a number of days, it frees the operator from the need to control and manually set reference values, is reliable inasmuch as it is based on a very large number of samplings, and it is easy and simple to carry out, as it may utilize almost every normal microcomputer available on the market.

As will be apparent to a person skilled in the art, it is possible to provide very different arrangements of the various components of the apparatus of the invention, in order to achieve the same results. For instance, it is possible to provide a double interface, one for line voltage analysis and one for the audio transmissions, although this is a more expensive solution. Likewise, it is possible to employ different types of modems and analogue-to-digital transducers, to connect them in different ways, to change the order or type of elaboration of the various signals, to provide additional storage and/or retrieval and/or viewing means. Furthermore, it is possible to provide many modifications in the monitoring and analysis method of the invention. For instance, it is possible to activate another system, e.g., a loudspeaker, rather than recording the conversation which is taking place on the telephone line, although this is normally not advantageous. Likewise, it is possible to connect devices which utilize the method of the invention to a variety of outlets and recording or activating devices, to obtain different responses to an activity detected on the telephone line, all without exceeding the scope of the invention.

I claim:

1. Fax monitoring apparatus, comprising:
   line interface means connected in parallel to a telephone line for simultaneously detecting and analyzing audio signals produced on the telephone line by two fax machines communicating through the telephone line;
   analysis means for analyzing and interpreting the audio signals to form a compressed fax image;
   expansion means for expanding the compressed fax image into a bit-mapped image;
   storage means for storing the compressed fax image and/or the bit-mapped image; and
   display means for displaying the bit-mapped image of the original fax transmission.

2. Apparatus according to claim 1, wherein the storage means comprises a temporary memory or buffer, and one or more hard disks.

3. Apparatus according to claim 2, wherein the storage means further comprises one or more of the following: a digital cartridge recorder, a floppy diskette drive and an optical disk drive.

4. Apparatus according to any one of claims 1 to 3, wherein the analysis means comprises a modem and wherein a separate modem is provided for each monitored telephone line.

5. Apparatus according to claim 4, further comprising an analog-to-digital transducer connected in series to each modem, to transform into digital storable information audio signals transmitted through the telephone line.

6. A method of monitoring fax communication in a system that includes: line interface means connected to a telephone line to be monitored; activating means for detecting line activity comprising one of start/stop activity, ringing and dialing pulse and DTMF signalling; and interpreting means activated by the activating means, the method comprising the steps of:
   connecting line interface means in parallel to a telephone line for simultaneously detecting and analyzing audio signals produced on the telephone line by two fax machines communicating through the corresponding telephone lines;
   interpreting fax transmission by means of the interpreting means when line activity is detected;
   assembling the interpreted fax transmission into compressed fax images;
   storing the compressed fax images in memory means;
   retrieving the stored compressed fax images and expanding them to bit-mapped images on display means; and
   displaying the bit-mapped images on the display means.

7. A method according to claim 6, wherein the display means comprise a screen and/or a printer.

* * * * *

UNITED STATES PATENT AND TRADEMARK OFFICE
CERTIFICATE OF CORRECTION

PATENT NO. : 5,347,572
DATED : September 13, 1994
INVENTOR(S) : Avni

It is certified that error appears in the above-indentified patent and that said Letters Patent is hereby corrected as shown below:

In column 5, line 33, "con, pressed" should be --compressed--.

In column 8, lines 32 and 50, "to" should be --$t_0$--.

Signed and Sealed this

Twenty-first Day of November, 1995

Attest:

BRUCE LEHMAN

Attesting Officer    Commissioner of Patents and Trademarks